US009351432B2

(12) United States Patent
Tsuboi

(10) Patent No.: US 9,351,432 B2
(45) Date of Patent: May 24, 2016

(54) DRIVER DEVICE

(71) Applicant: DENSO CORPORATION, Kariya, Aichi-pref. (JP)

(72) Inventor: Takashi Tsuboi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/553,170

(22) Filed: Nov. 25, 2014

(65) Prior Publication Data

US 2015/0156927 A1    Jun. 4, 2015

(30) Foreign Application Priority Data

Nov. 29, 2013  (JP) ................................ 2013-247472

(51) Int. Cl.
*H05K 7/20* (2006.01)
*G06F 1/20* (2006.01)

(52) U.S. Cl.
CPC ................................ *H05K 7/20854* (2013.01)

(58) Field of Classification Search
CPC . H05K 7/20; H05K 7/20509; H05K 7/20854; H05K 5/18; H05K 5/22; H05K 9/00; H05K 9/06; H05K 9/22; G06F 1/20; H02K 1/04; H02K 7/102; H02K 16/00
USPC ............... 361/679.46, 679.54, 704, 705, 707, 361/709, 710, 712, 714, 715, 719; 310/43, 310/51, 52, 58, 64, 68 B, 68 D, 68 R, 71, 72, 310/77, 112; 165/80.2, 104.33, 185; 29/592.1, 598
See application file for complete search history.

(56) References Cited

U.S. PATENT DOCUMENTS

| | | | | |
|---|---|---|---|---|
| 3,809,935 A | * | 5/1974 | Kristen ................... | H02K 29/08 310/68 R |
| 6,177,740 B1 | * | 1/2001 | Burns ..................... | H02K 5/225 310/64 |
| 8,436,500 B2 | * | 5/2013 | Minato .............. | H02K 11/0073 310/68 C |
| 8,646,568 B2 | * | 2/2014 | Yamasaki ............ | B62D 5/0406 180/400 |
| 8,659,194 B2 | * | 2/2014 | Motoda .............. | H02K 11/0073 310/64 |

(Continued)

FOREIGN PATENT DOCUMENTS

| | | | |
|---|---|---|---|
| JP | H06-264857 | 9/1994 | |
| JP | 2006-049618 | 2/2006 | |
| JP | 02006187149 A | * 7/2006 | ............. H02K 11/00 |

OTHER PUBLICATIONS

Hiramine et al., U.S. Appl. No. 14/553,025, filed Nov. 25, 2014.
(Continued)

*Primary Examiner* — Michail V Datskovskiy
(74) *Attorney, Agent, or Firm* — Nixon & Vanderhye P.C.

(57) ABSTRACT

A driver device has a rear frame end disposed on an axial end of a motor, a heat sink on which a power module is fastened, and a connector case disposed on an outside of the heat sink having a first connector and a second connector for an external connection. A plate is fastened onto the connector case, with a motor-facing contact face of the plate contacting the rear frame end and a motor-facing-away contact face of the plate contacting the heat sink. Heat conductivity of the plate is equal to or greater than that of the rear frame end and that of the heat sink combined. Thus, a gap between the rear frame end and the heat sink is sealed and heat from the heat sink on which the power module is fastened is appropriately transmitted to the rear frame end.

8 Claims, 14 Drawing Sheets

(56) References Cited

U.S. PATENT DOCUMENTS

| | | | | |
|---|---|---|---|---|
| 8,816,548 | B2 * | 8/2014 | Tomizawa | H02K 11/0073 310/67 R |
| 8,841,808 | B2 * | 9/2014 | Tang | H02K 11/0073 310/52 |
| 8,987,960 | B2 * | 3/2015 | Li | H02K 5/04 310/68 R |
| 9,071,113 | B2 * | 6/2015 | Abe | H02K 11/0073 |
| 9,088,195 | B2 * | 7/2015 | Yamasaki | B62D 5/0406 |
| 9,124,155 | B2 * | 9/2015 | Yamasaki | B62D 5/0406 |
| 2011/0285223 | A1 * | 11/2011 | Miyachi | H02K 11/0073 310/64 |
| 2011/0286185 | A1 * | 11/2011 | Abe | H05K 7/209 361/710 |
| 2012/0098361 | A1 * | 4/2012 | Yamasaki | B62D 5/0406 310/52 |
| 2013/0069454 | A1 * | 3/2013 | Motoda | H02K 11/0073 310/52 |

OTHER PUBLICATIONS

Hiramine et al., U.S. Appl. No. 14/553,061, filed Nov. 25, 2014.
Miyachi, U.S. Appl. No. 14/553,090, filed Nov. 25, 2014.
Matsuo, et al., U.S. Appl. No. 14/553,121, filed Nov. 25, 2014.

* cited by examiner

DRIVER DEVICE

CROSS REFERENCE TO RELATED APPLICATION

The present application is based on and claims the benefit of priority of Japanese Patent Application No. 2013-247472, filed on Nov. 29, 2013, the disclosure of which is incorporated herein by reference.

TECHNICAL FIELD

The present disclosure generally relates to a driver device.

BACKGROUND INFORMATION

Conventionally, an electronic control unit (ECU) may be disposed in an engine compartment of a vehicle. For example, the ECU disclosed in a patent document 1 (i.e., Japanese Patent No.: JP-A-2006-49616) has a heat sink sealed on one side of an insert-molded housing made of an insulating resin. The ECU also has a cover sealed on the other side of the insert-molded housing. Further, the insert-molded housing of such an ECU has a connector integrally formed thereon.

As shown in the patent document 1, when a resin-made housing is disposed at a position between the heat sink and the cover, the housing may hinder heat dissipation from the heat sink to the cover because thermal conductivity of the resin-made housing is low. Further, to prevent creep from occurring to the housing, a screw hole for accepting a screw may have an iron collar inserted therein, for example. By having the iron collar, both ends of the iron collar and the heat sink/cover may have metal-metal contact with each other. However, even with such a structure, due to the heat conductivity of iron being lower than that of aluminum and a small contact area size, the heat conductivity for dissipating heat from the heat sink to the other parts via the collar may still be low.

SUMMARY

It is an object of the present disclosure to provide a driver device that is capable of dissipating heat from a heat generator via a separate component, to which heat of the heat generator is transmitted via a heat dissipater that has the heat generator fastened thereon.

A driver device of the present disclosure is provided with a motor, a first heat dissipater, a second heat dissipater, a connector case, and a plate member. The motor is driven by an electric power supply to a winding wire. The first heat dissipater is disposed on one axial end of the motor. The second heat dissipater has a heat generator disposed thereon.

The connector case is disposed on an outside of the second heat dissipater, and has a connector used for a connection with an external device.

The plate member is attached to a plate base that is formed on the connector case, and the plate member contacts the first heat dissipater with a motor-facing contact face which faces the motor, and contacts the second heat dissipater with a motor-facing-away contact face which faces away from the motor.

Thermal conductivity of the plate member is equal to or greater than thermal conductivity of the first heat dissipater and thermal conductivity of the second heat dissipater combined.

Further, in the present disclosure, the plate member has a first hole into which a first fastening member is inserted to fasten the second heat dissipater to the first heat dissipater in a binding manner with the plate member interposed therebetween.

Also, in the present disclosure, the plate member has a second hole into which a second fastening member is inserted to fasten the connector case to the second heat dissipater.

Even further, in the present disclosure, the motor-facing contact face protrudes toward the motor from the plate base.

Further, in the present disclosure, the second heat dissipater has a plate contact part that is shaped to engage the motor-facing-away contact face of the plate base.

Additionally, in the present disclosure, the connector case has a plurality of plate members attached thereto.

Still further, in the present disclosure, the plurality of plate members has an identical shape.

Moreover, in the present disclosure, each of the plurality of plate members has different shapes.

According to the present embodiment, the plate member is fastened to the connector case for having a metal-metal contact with the first heat dissipater. Therefore, waterproofing between the first heat dissipater and the connector case is realized.

The plate member contacts the first heat dissipater with the motor-facing contact face, and contacts the second heat dissipater with the motor-facing-away contact face. Further, thermal conductivity of the plate member is equal to or greater than thermal conductivity of the first heat dissipater and thermal conductivity of the second heat dissipater. Therefore, compared with a case where thermal conductivity of the plate member is smaller than thermal conductivity of the first heat dissipater or thermal conductivity of the second heat dissipater, heat of the second heat dissipater on which the heat generator is fastened can be appropriately transmitted to the first heat dissipater side. Thus, heat of the second heat dissipater is dissipated to the external device via the plate member and the first heat dissipater.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Hereafter, the driver device by the present disclosure is described with reference to the drawings. In the following, like parts have like numbers and redundant description is not provided.

First Embodiment

Figure 1:
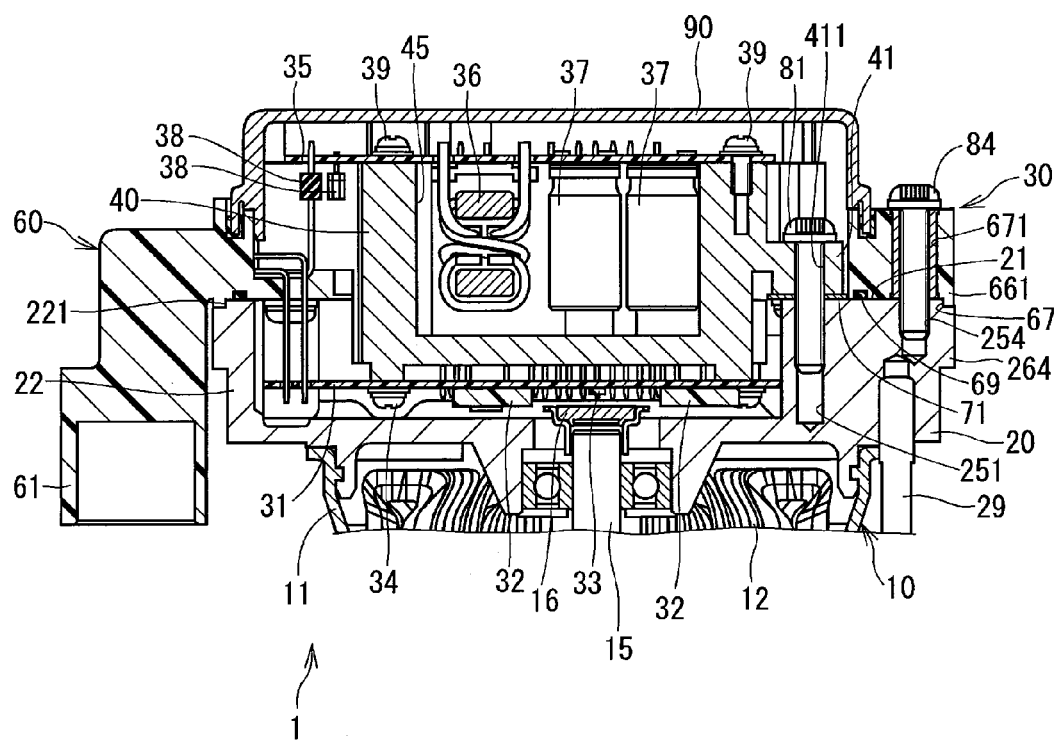
FIG. 1 is a sectional view of a driver device in a first embodiment of the present disclosure.
Figure 2:
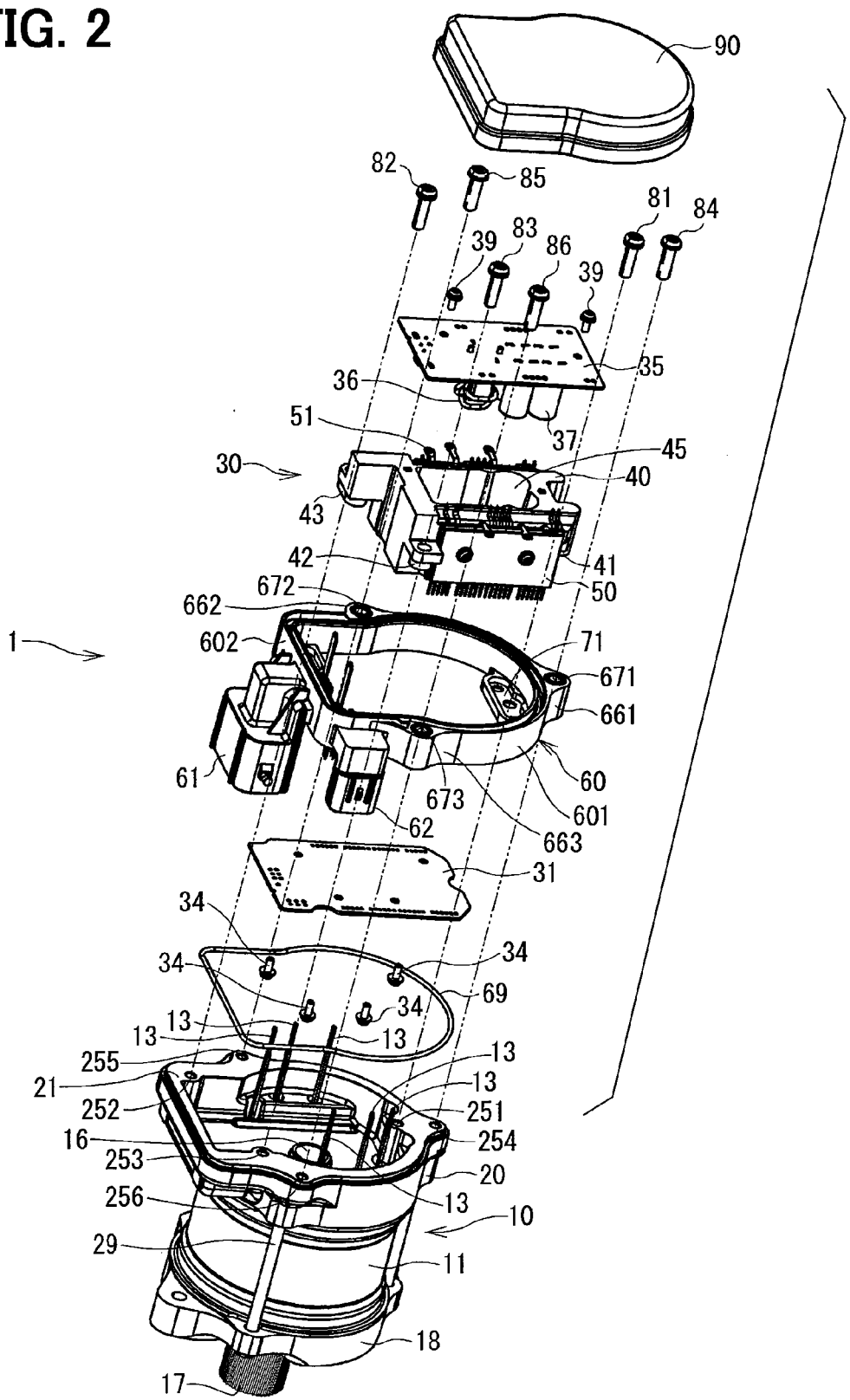
FIG. 2 is an exploded perspective view of the driver device in the first embodiment of the present disclosure.
Figure 3:
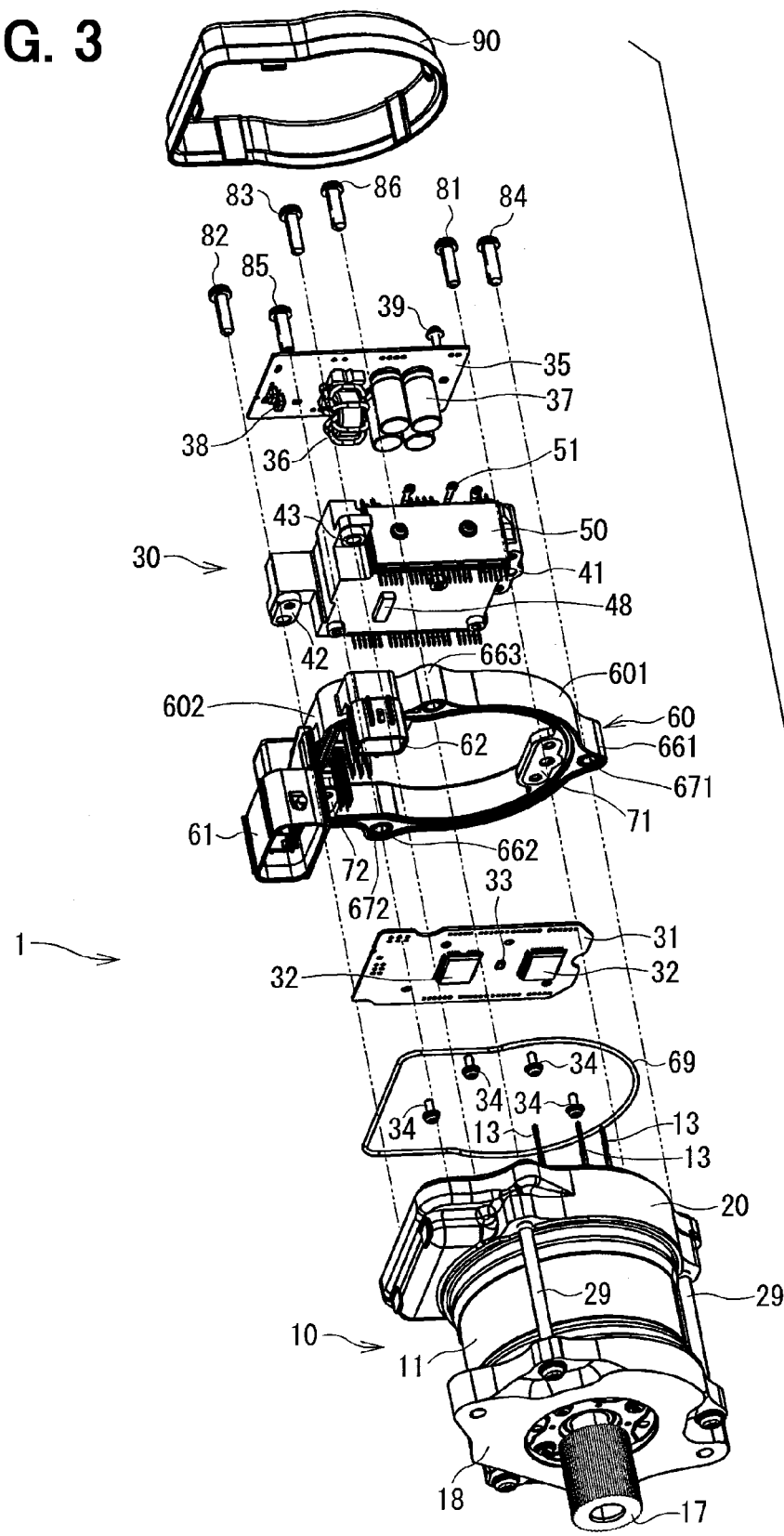
FIG. 3 is another exploded perspective view of the driver device in the first embodiment of the present disclosure.

The driver device in the first embodiment of the present disclosure is described based on FIGS. 1-13. A driver device 1 is applied to an electric power steering device. As shown in FIGS. 1, 2, and 3, the driver device 1 is a drive device that has a motor 10 and a control unit 30 integrally housed in one body, in which the control unit 30 is positioned on one axial end side of the motor 10. The motor 10 in the driver device 1 is a three-phase brushless motor, and is driven under control of the control unit 30.

The motor case 11 is formed in a cylindrical shape, for example, from metal, etc. A stator (not illustrated) on which a winding wire 12 is wound is fastened in an inside of the motor case 11. The winding wire 12 constitutes the three-phase winding wire which consists of a U phase coil, a V phase coil, and a W phase coil. The winding wire 12 constitutes two sets of three-phase winding wire in the present embodiment. The motor 10 is driven by an electric power supply to the winding wire 12.

Six pieces of motor line 13 are provided in correspondence to each of three phases of the winding wire 12, and those motor lines 13 are inserted into a motor line insertion part 23 of a rear frame end 20, and extend toward a control unit 30 side.

On an inside of the stator, a rotor (not illustrated) is rotatably disposed. A shaft 15, made of metal, for example, is fastened to an axial center of the rotor that has an approximately cylindrical shape. Thus, the shaft 15 and the rotor rotate together.

On one end of the shaft 15 which is close to the control unit 30, a magnet 16 is disposed. On an opposite end of the shaft 15 which is opposite to the control unit 30, a joint 17 is disposed.

A front frame end 18 is made of metal to have an approximate circular table shape, for example, and covers an opposite end of the motor case 11, which is opposite to the control unit 30. From the front frame end 18, the joint 17 which outputs rotation of the motor 10 to the external device is exposed.

As shown in FIGS. 1-4, the rear frame end 20 serving as a first heat dissipater is made of thermally conductive metal, such as aluminum, to have an approximate circular table shape, for example, and covers an end of the motor case 11 which is close to the control unit 30. On the control unit 30 side of the rear frame end 20, a wall portion 22 substantially having a ring shape to extend along a periphery of the rear frame end 20 is formed. On an outer periphery of the wall portion 22, a step portion 221 for an engagement with a connector case 60 is formed.

Figure 4:
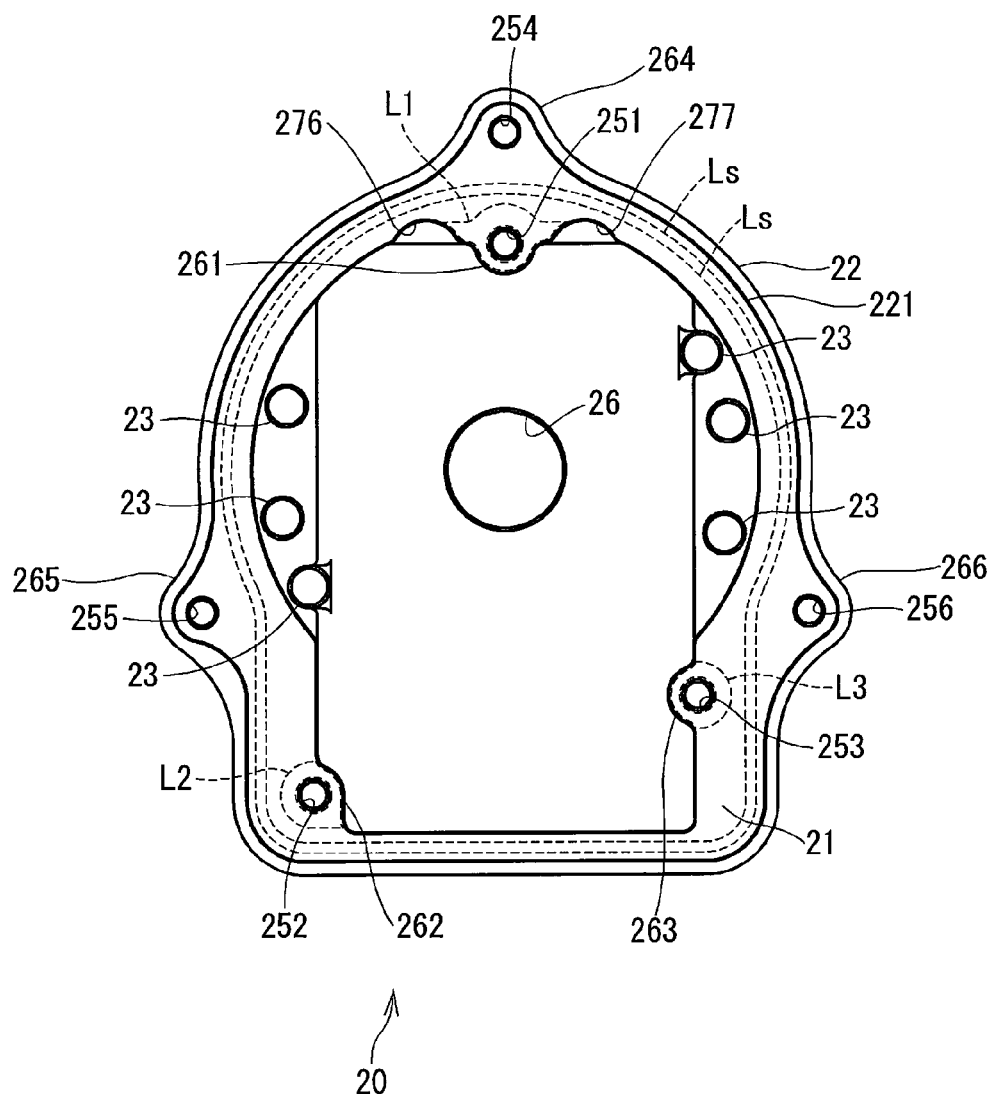
FIG. 4 is a plan view of a frame end in the first embodiment of the present disclosure.

On an end of the wall portion 22, which is close to the control unit 30, a contact surface 21, which contacts with plates 71-73, and a seal member 69, which is mentioned later, is formed. In FIG. 4, broken lines L1-L3 respectively show contact areas of the contact surface 21, which contact the plates 71-73, and a dashed line Ls shows a contact area of the contact surface 21, which contacts the seal member 69.

On the wall portion 22, tab parts 261, 262, 263, which respectively project toward a radial inside, are formed. On those tab parts 261, 262, 263, screw-thread holes 251-253 are bored at positions corresponding to first holes 711, 721, 731 that are mentioned later. Further, on the wall portion 22, tab parts 264, 265, 266, which respectively project toward a radial outside, are formed. On those tab parts 264, 265, 266, screw-thread holes 254, 255, 256 are bored at positions corresponding to through holes 671-673 that are mentioned later.

Further, on the wall portion 22, for avoiding interference with screws 76, 77 mentioned later, recess portions 276, 277 are formed.

On a radial inside of the wall portion 22, the motor line insertion part 23 into which the motor line 13 is inserted is formed. Further, an opening 26 is formed on the rear frame end 20 substantially at its center. The opening 26 is formed to be greater than the magnet 16. In such manner, the magnet 16 is exposed to the control unit 30 from the opening 26.

As shown in FIGS. 1-3, the front frame end 18 and the rear frame end 20 are screw-fastened to each other with a through bolt 29 that is inserted from a front frame end 18 side, binding the motor case 11 in between. Thereby, the motor case 11, the front frame end 18, and the rear frame end 20 constitute an outer shell of the motor 10.

The control unit 30 comprises a control board 31, a power board 35, a heat sink 40 serving as the second heat dissipater, a power module 50 serving as the heat generator, the connector case 60, a first plate 71, a second plate 72, a third plate 73 respectively serving as the plate member (refer to FIG. 8 etc.), together with other components. The first plate 71, the second plate 72, and the third plate 73 may also be designated simply as the "plates 71, 72, 73."

The control board 31 is fastened to a motor 10 side of the heat sink 40 with a screw 34. On the control board 31, control electronic components 32, such as a microcomputer a Hall IC, and the like, are mounted. Further, at a position facing the magnet 16 on the control board 31, a rotation angle sensor 33 for detecting a rotation position of a rotor and the shaft 15 of the motor 10 is disposed.

The power board 35 is fastened to an opposite side of the heat sink 40, which is opposite to the motor 10, with a screw 39. On the power board 35, power electronic components controlling a comparatively large electric current such as a choke coil 36, capacitors 37 and 38 and the like are mounted. The capacitor 37 of the present embodiment may be an aluminum electrolytic capacitor, for example, and the capacitor 38 may be a laminated ceramic capacitor, for example.

The heat sink 40 is made of thermally conductive material, e.g. aluminum, and holds the control board 31, the power board 35, and the power module 50.

Figure 5:
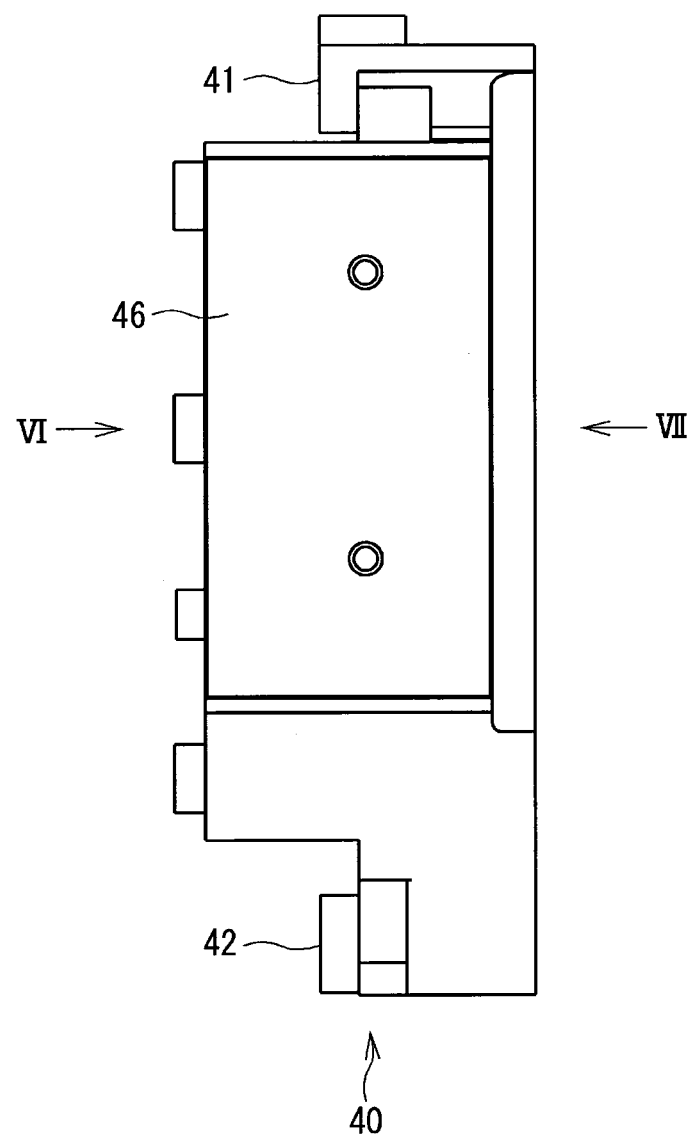
FIG. 5 is a side view of a heat sink in the first embodiment of the present disclosure.
Figure 6:
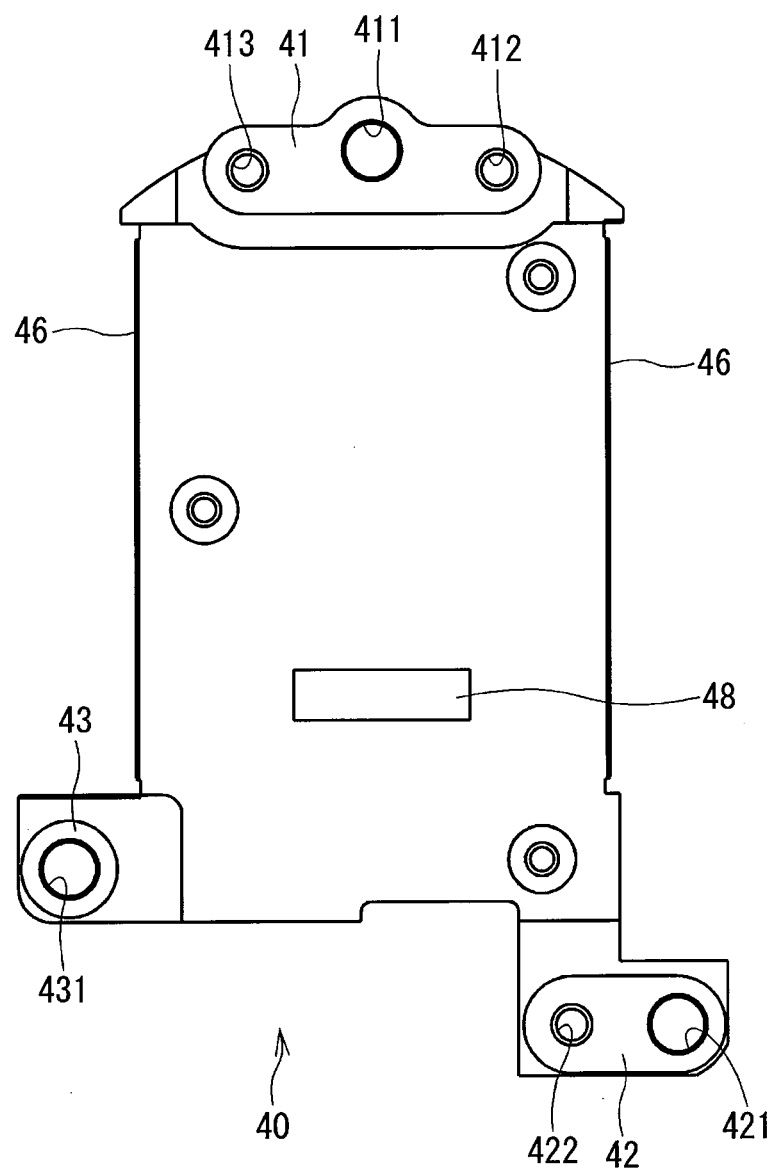
FIG. 6 is a view of the heat sink seen from an arrow VI direction in FIG. 5.
Figure 7:
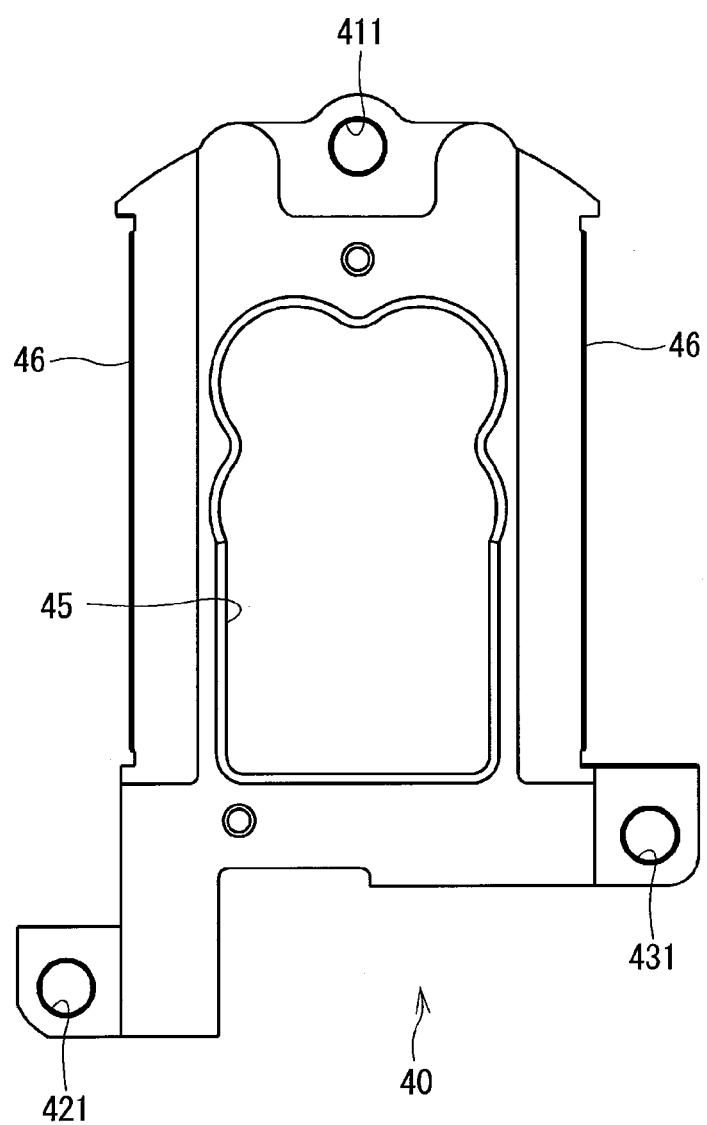
FIG. 7 is a view of the heat sink seen from an arrow VII direction in FIG. 5.

The heat sink 40 of the present embodiment is shown in FIGS. 5, 6, and 7. FIG. 6 shows a motor 10 side view of the heat sink 40, and FIG. 7 shows an away-from-motor 10 side view of the heat sink 40.

As shown in FIGS. 5-7, a chamber room 45 for accommodating the choke coil 36 and the capacitor 37, which are mounted on the power board 35, are formed on a power board 35 side of the heat sink 40. Further, on a side face of the heat sink 40, a module mounting surface 46 holding the power module 50 is formed. Further, on a control board 31 side face of the heat sink 40, a pedestal 48 contacting the control board 31 is formed. On the pedestal 48, a thermal grease is applied. Thereby, heat of the control electronic components 32 mounted on the control board 31 is dissipated to the heat sink 40.

Further, on the heat sink 40, a first plate contact part 41 for contacting the first plate 71, a second plate contact part 42 for contacting the second plate 72, and a third plate contact part 43 for contacting the third plate 73 are formed. In the following, those contact parts 41, 42, 43 may also be designated simply as "plate contact parts 41, 42, 43."

As shown in FIG. 6, the first plate contact part 41 is shaped to fit to a first plate base 651 (refer to FIG. 9), and contacts the first plate 71. On the first plate contact part 41, a through hole 411 and screw-thread holes 412, 413 are bored. The through hole 411 is formed substantially at the center of the first plate contact part 41, and the screw-thread holes 412, 413 are formed on both sides of the through hole 411.

The second plate contact part 42 is shaped to fit to a second plate base 652 (refer to FIG. 9), and contacts the second plate 72. On the second plate contact part 42, a through hole 421 and a screw-thread hole 422 are bored. In the present embodiment, the through hole 421 is formed on an outside, and the screw-thread hole 422 is formed on an inside.

The third plate contact part 43 is shaped to fit to a third plate base 653 (refer to FIG. 9), and contacts the third plate 73. A through hole 431 is bored on the third plate contact part 43.

The power module 50 has a switching element which switches an electric current supplied to the winding wire 12, and is fastened to the module mounting surface 46 of the heat sink 40. The power module 50, which is vertically arranged along the module mounting surface 46, is connected to both of the control board 31 and the power board 35. Further, on an opposite side of the power module 50 away from the motor 10, a motor terminal 51 is formed, and the motor terminal 51 is connected to the motor line 13 that extends to the opposite side of the power module 50 away from the motor 10.

As shown in FIGS. 1-3, 8, and 9, the connector case 60 made of resin has a ring shape, and accommodates the heat sink 40 in its radial inside. That is, the heat sink 40 is not exposed to an outside of the driver device 1. In the present embodiment, the rear frame end 20 is exposed to an outside of the driver device 1.

The connector case 60 is made up from an arc part 601 having an arc shape in a plane view and a connector formation part 602 continuously extending from the arc part 601 to have a square shape. On a motor 10 side outer periphery of the connector case 60, a step part 67 that fits into the step portion 221 of the rear frame end 20 is formed.

On a radial inside of the step portion 67, a slot 68, into which the seal member 69 is inserted, is formed. The seal member 69 is made of silicone rubber, etc., for example. The seal member 69 is inserted into the slot 68, and contacts the contact surface 21 of the rear frame end 20 at a predetermined crush rate. Further, an entire periphery of an opposite side of the connector case 60 opposite to the motor 10 is attached to a cover member 90 with an adhesive. Thereby, the driver device 1 of the present embodiment is provided with a waterproof structure that prevents water to go into the apparatus.

On the connector formation part 602, a first connector 61 and a second connector 62 are formed. The first connector 61 is used for connection with an electric power supply, and for connection with CAN (Controller Area Network), etc. The second connector 62 is used for connection with a torque sensor, etc., which detects a steering torque inputted by a driver's operation when a driver operates a non-illustrated steering wheel. According to the present embodiment, the first connector 61 and the second connector 62 correspond to a "connector" in the claims.

Figure 8:
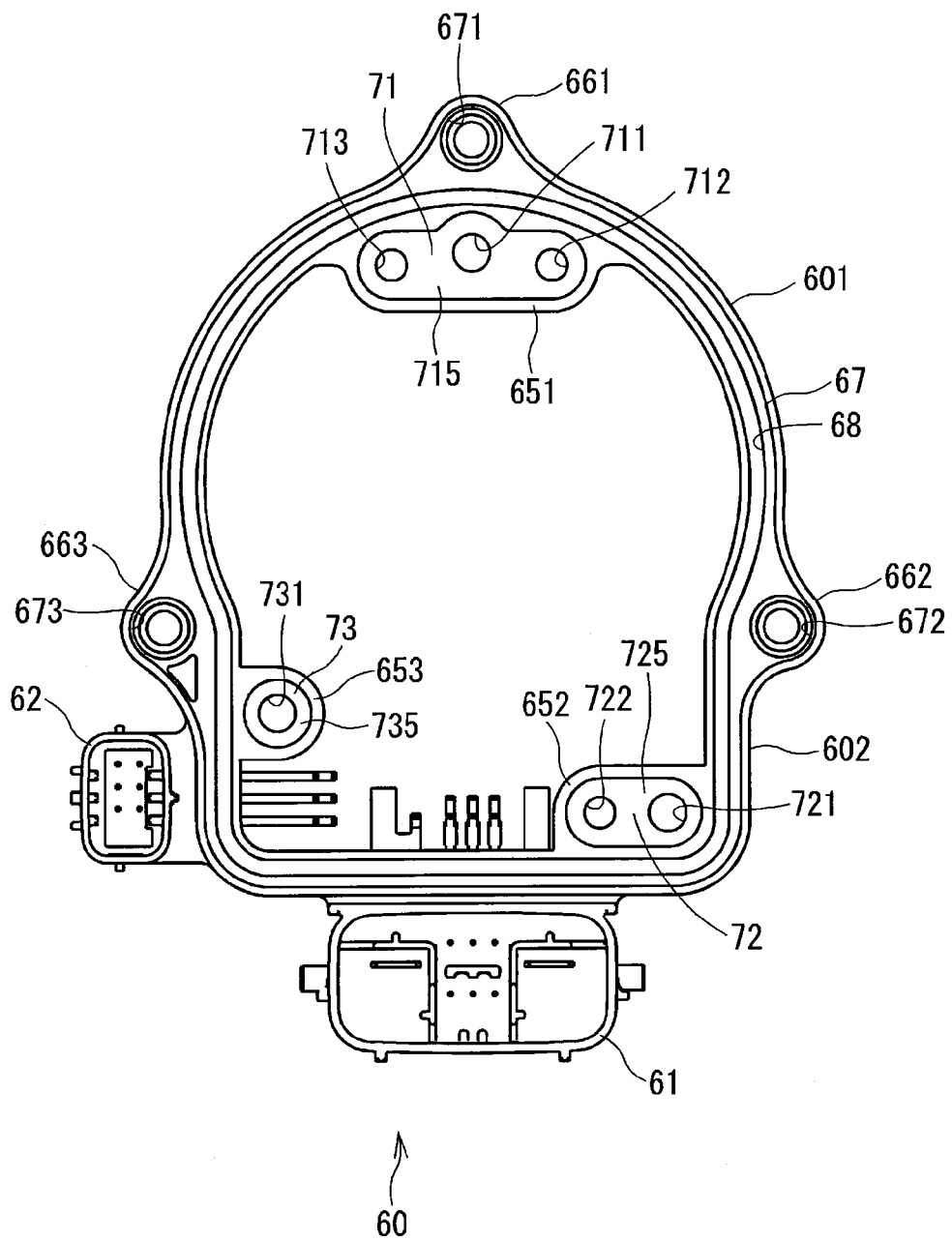
FIG. 8 is a plan view of a connector case seen from a motor-facing in the first embodiment of the present disclosure.
Figure 9:
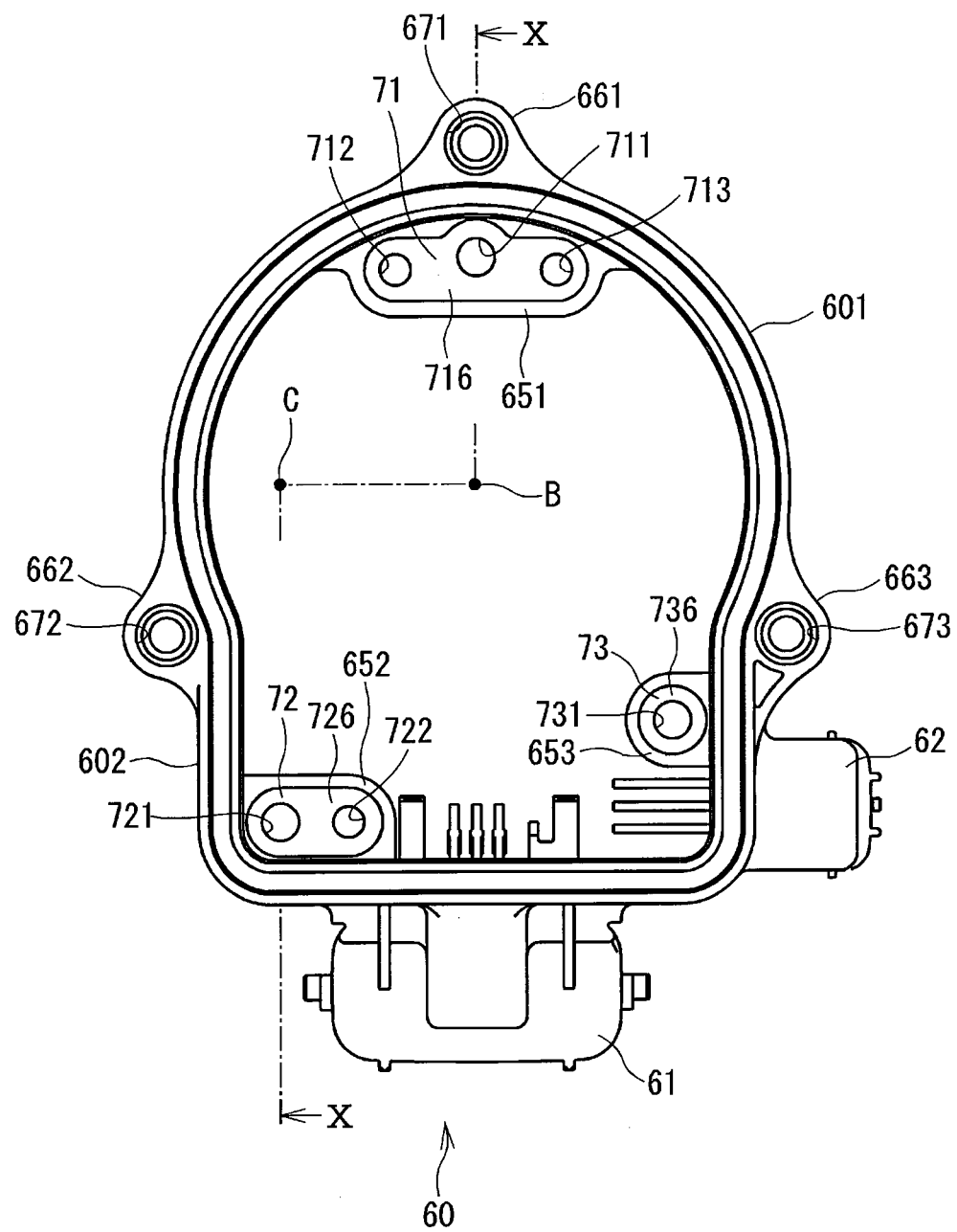
FIG. 9 is a plan view of the connector case seen from an opposite side of the motor in the first embodiment of the present disclosure.

As shown in FIGS. 8 and 9, the first plate base 651, the second plate base 652, and the third plate base 653 are formed to project toward a radial inside from the connector case 60.

The first plate base 651 is positioned on an opposite side of the first connector 61 in the connector case 60, substantially at the center of the arc part 601. The second plate base 652 is positioned on an opposite side of the second connector 62 in the connector case 60, extending along one side of the connector formation part 602 on which the first connector 61 is formed. The third plate base 653 is formed on a side of the connector formation part 602 on which the second connector 62 is formed.

Further, on the connector case 60, a first through hole formation part 661, a second through hole formation part 662, and a third through hole formation part 663 are respectively formed to project toward a radial outside thereof.

The first through hole formation part 661 is positioned on an opposite side of the first connector 61 in the connector case 60, substantially at the center of the arc part 601. The second through hole formation part 662 and the third through hole formation part 663 are symmetrically formed at a connecting portion between the arc part 601 and the connector formation part 602. The second through hole formation part 662 is positioned on one side close to the second plate base 652, and the third through hole formation part 663 is positioned on the other side close to the third plate base 653. The through hole formation parts 661-663 are shaped to fit to the tab parts 264-266 of the rear frame end 20.

A first through hole 671 is formed on the first through hole formation part 661, and a second through hole 672 is formed on the second through hole formation part 662, and a third through hole 673 is formed on the third through hole formation part 663. To prevent creep from occurring in the resin, metal collars, such as iron collars, are inserted and fastened respectively to the first through hole 671, the second through hole 672, and the third through hole 673.

The plates 71, 72, 73 having a board shape are made of thermally-conductive material such as copper or the like, which is more specifically configured to have thermal conductivity equal to or higher than that of the rear frame end 20 and the heat sink 40. According to the present embodiment, the rear frame end 20 and the heat sink 40 are made of aluminum, and the plates 71, 72, 73 are, in consideration of thermal conductivity, strength, etc., made of copper.

The plates 71, 72, 73 are insert-molded to be buried in the connector case 60. More specifically, the first plate 71 is insert-molded in the first plate base 651, the second plate 72 is insert-molded in the second plate base 652, and the third plate 73 is insert-molded in the third plate base 653. According to the present embodiment, the plate bases 651, 652, 653 are formed at the same height position, and the plates 71, 72, 73 are insert-molded at the same height position. Further, each of the thickness of plates 71, 72, 73 has the same thickness.

The first hole 711 and the second holes 712, 713 are bored on the first plate 71. The first hole 711 is formed substantially at the center of the first plate 71, and the second holes 712, 713 are formed on both sides of the first hole 711. A motor-facing contact face 715, which is a face of the first plate 71 on one side close to the motor 10, contacts the rear frame end 20 by the contact surface 21. A motor-facing-away contact face 716, which is a face of the first plate 71 on an opposite side of the motor 10, contacts the first plate contact part 41 of the heat sink 40.

The first hole 721 and the second hole 722 are bored on the second plate 72. A motor-facing contact face 725, which is a face of the second plate 72 facing the motor 10, contacts the rear frame end 20 by the contact surface 21. A motor-facing-away contact face 726, which is a face of the second plate 72 facing away from the motor 10, contacts the second plate contact part 42 of the heat sink 40.

The first hole 731 is bored on the third plate 73. A motor-facing contact face 735, which is a face of the third plate 73 facing the motor 10, contacts the contact surface 21 of the a rear frame end 20. A motor-facing-away contact face 736, which is a face of the third plate 73 facing away from the motor 10, contacts the third plate contact part 43 of the heat sink 40.

According to the present embodiment, the motor-facing contact faces 715, 725, 735 contact the rear frame end 20 in part (refer to FIG. 4). Further, the motor-facing-away contact faces 716, 726, 736 contact the heat sink 40 along their entire surfaces.

Here, assembly to combine the rear frame end 20, the heat sink 40, and the connector case 60 is described with reference to FIGS. 2-9, 12, and 13.

First, the screw 76 is inserted into the second hole 712 of the first plate 71 from the motor 10 side, and is fastened to the screw-thread hole 412 of the heat sink 40. The screw 77 is inserted into the second hole 713 of the first plate 71 from the motor 10 side, and is fastened to the screw-thread hole 413 of the heat sink 40. The screw 78 is inserted into the second hole 722 of the second plate 72 from the motor 10 side, and is fastened to the screw-thread hole 422 of the heat sink 40. Thereby, the connector case 60 is screw-fastened onto the heat sink 40 from the motor 10 side.

The screw 81 is inserted into the through hole 411 of the heat sink 40 and into the first hole 711 of the first plate 71 from the away-from-motor side, and is fastened to the screw-thread hole 251 bored on the rear frame end 20. The screw 82 is inserted into the through hole 421 of the heat sink 40 and into the first hole 721 of the second plate 72 from the away-from-motor side, and is fastened to the screw-thread hole 252 bored on the rear frame end 20. The screw 83 is inserted into the through hole 431 of the heat sink 40 and into the first hole 731 of the third plate 73 from the away-from-motor side, and is fastened to the screw-thread hole 253 bored on the rear frame end 20. Thereby, the plates 71, 72, 73 are fastened by the screws 81, 82, 83 in a contact condition with both of the heat sink 40 and the rear frame end 20.

According to the present embodiment, the screws 81, 82, 83 correspond to a "first fastening member" and the screws 76, 77, 78 correspond to a "second fastening member" in the claims.

Further, the screw 84 is inserted into the first through hole 671 of the connector case 60 from the away-from-motor side, and is fastened to the screw-thread hole 254 bored on the rear frame end 20. The screw 85 is inserted into the second through hole 672 of the connector case 60 from the away-from-motor side, and is fastened to screw-thread hole 255 bored on the rear frame end 20. The screw 86 is inserted into the third through hole 673 of the connector case 60 from the motor 10 side, and is fastened to the screw-thread hole 256 bored on the rear frame end 20. Thereby, the heat sink 40 and the connector case 60 are fastened onto the rear frame end 20.

Figure 10:
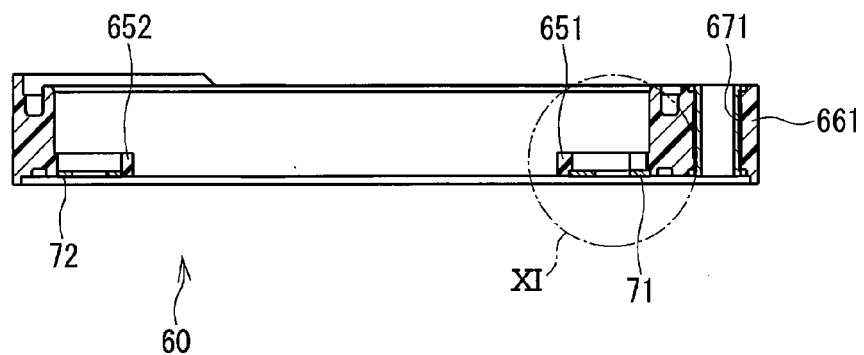
FIG. 10 is a cross sectional view along an X-B-C-X line in FIG. 9.
Figure 11:
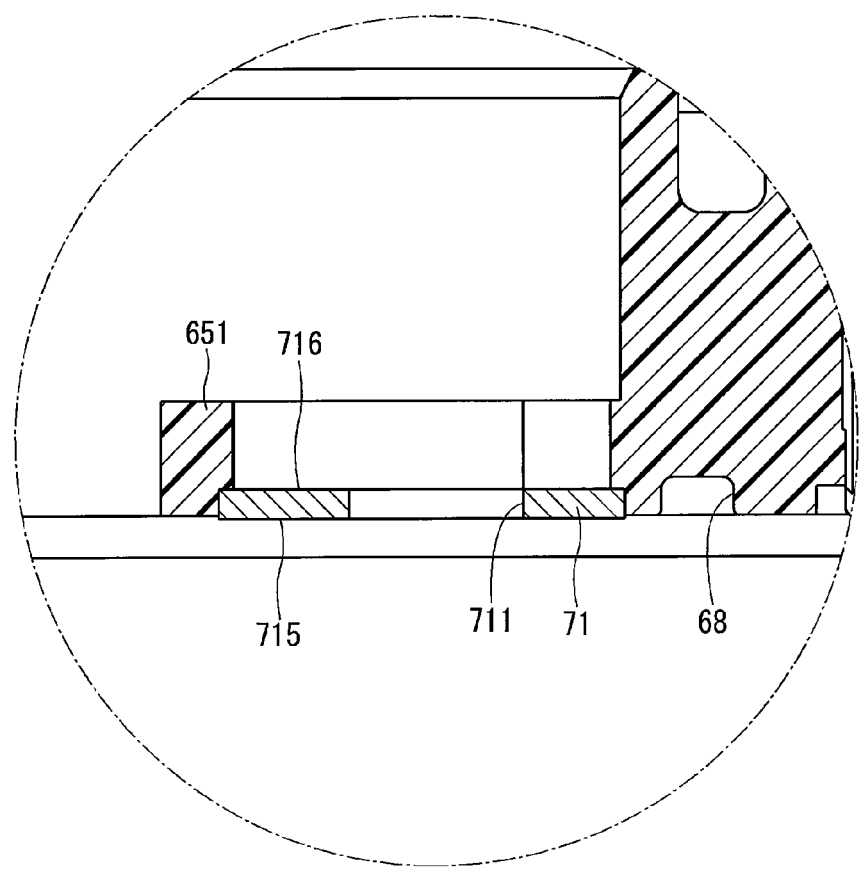
FIG. 11 is an enlarged view of a circle XI in FIG. 10.
Figure 12:
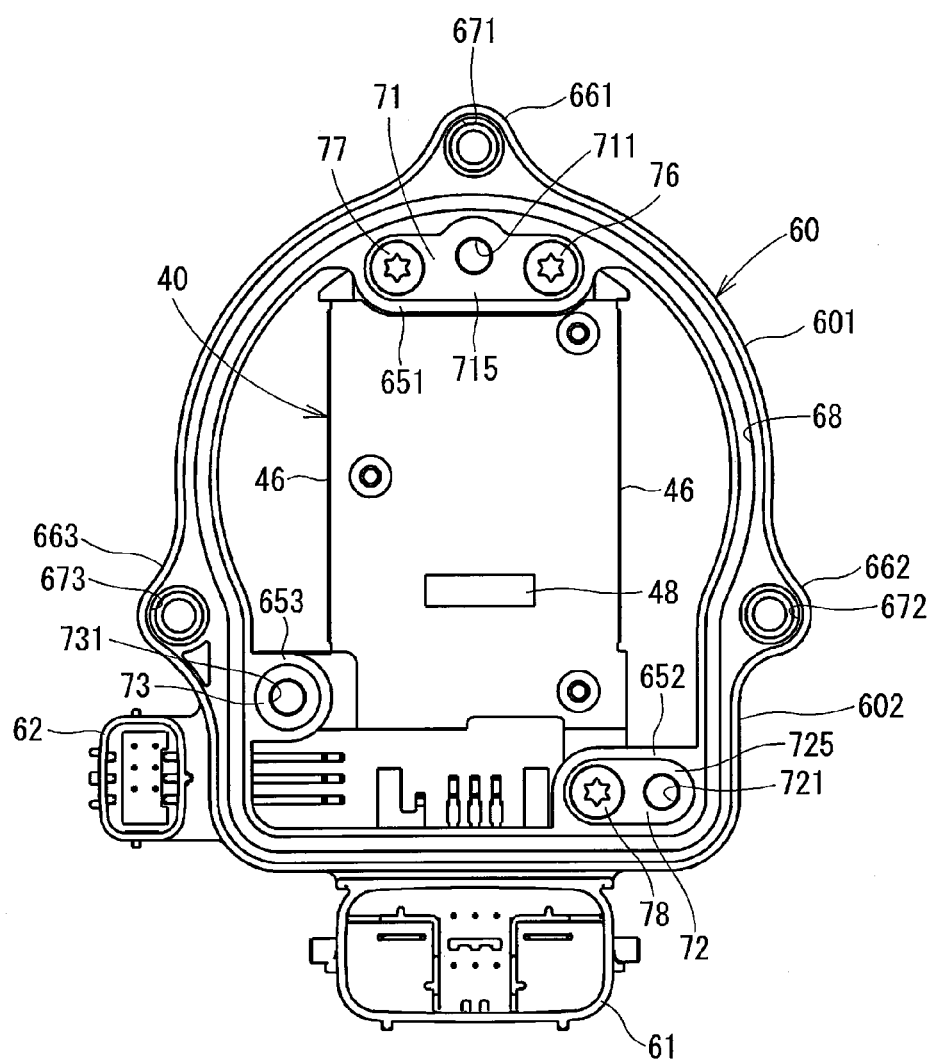
FIG. 12 is a plan view of a combination of the heat sink and the connector case seen from the motor-facing in the first embodiment of the present disclosure.
Figure 13:
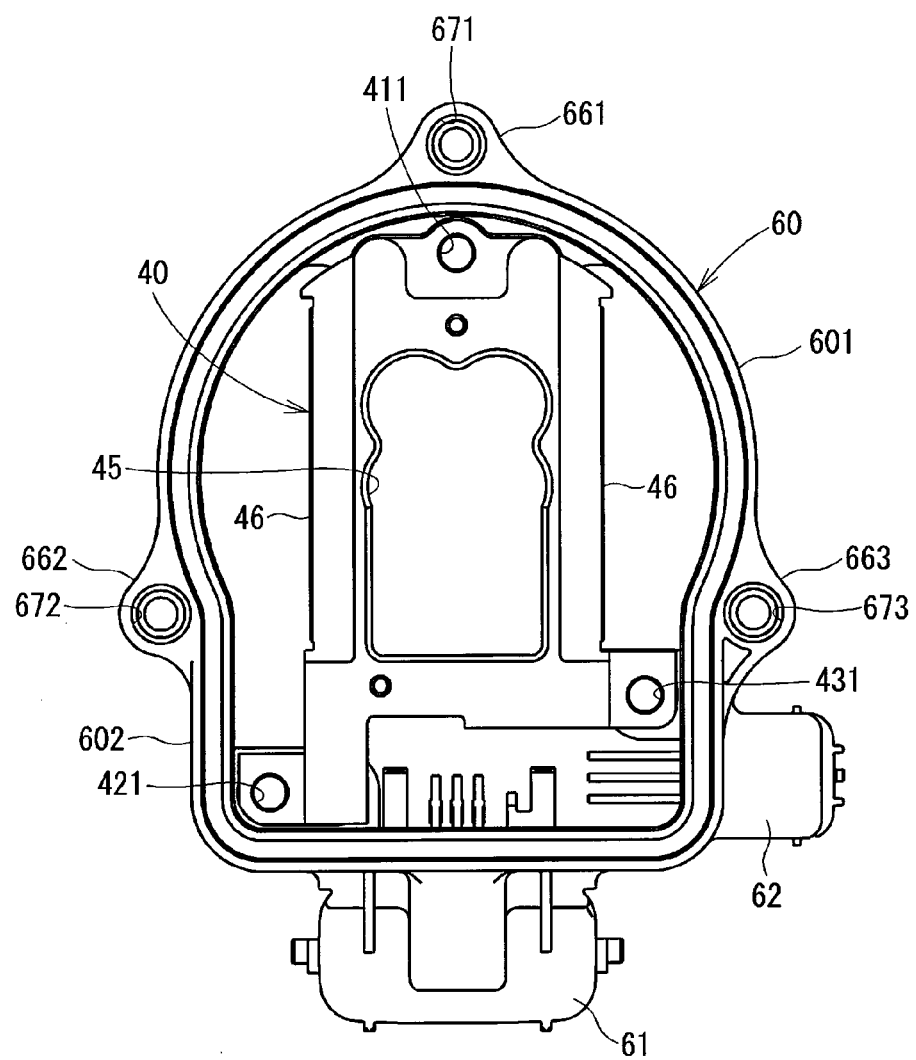
FIG. 13 is a plan view of the combination of the heat sink and the connector case seen from an opposite side of the motor in the first embodiment of the present disclosure.

As shown in FIGS. 10 and 11, the motor-facing contact face 715 of the first plate 71 projects toward the motor 10 side (i.e., a lower/bottom side in FIGS. 10 and 11) from the first plate base 651. Further, the crush rate of the seal member 69 is determined by a projecting amount of the first plate 71. Therefore, the contact between the first plate 71 and the rear frame end 20 is secured, which provides waterproof character therebetween.

The same structure is realized for the second plate 72 and for the third plate 73.

Further, in FIG. 10, the cross sectional view of the connector case 60 taken along an X-B-C-X line of FIG. 9 has the motor 10 side of the case 60 positioned on a lower/bottom side in the drawing.

According to the present embodiment, by providing the ring shape connector case 60 at a position between the rear frame end 20 and the cover member 90, the driver device 1 has a waterproof structure.

Further, by insert-molding the plates 71, 72, 73 in the connector case 60 for the contact with the heat sink 40 and the rear frame end 20, heat produced by the switching of the switching element in the power module 50 is dissipated from the rear frame end 20 to an outside of the apparatus 1 via the heat sink 40 and the plates 71, 72, 73. Further, the heat sink 40 need not be exposed to an outside of the apparatus 1 because heat is dissipated from the rear frame end 20 to an outside of the apparatus 1, resulting in that surface protection treatments of the heat sink 40, e.g. alumite treatment, become unnecessary, and saving work and cost of treating the heat sink 40.

As described in full details above, the driver device 1 of the present embodiment is provided with the motor 10, the rear frame end 20, the heat sink 40, the connector case 60, and plates 71, 72, 73.

The motor 10 is driven by an electric power supply to the winding wire 12. The rear frame end 20 is disposed on one axial end of the motor 10. The power module 50 is fastened to the heat sink 40.

The connector case 60 is disposed on the outside of the heat sink 40, and has the first connector 61 and the second connector 62 which are used for connection with the external device.

The plates 71, 72, 73 are fastened to the plate bases 651, 652, 653 that are disposed on the connector case 60, contact the rear frame end 20 by the motor-facing contact faces 715, 725, 735, and contact the heat sink 40 by the motor-facing-away contact faces 716, 726, 736. Thermal conductivity of the plates 71, 72, 73 is equal to or greater than thermal conductivity of the rear frame end 20 and thermal conductivity of the heat sink 40.

According to the present embodiment, since the plates 71, 72, 73 are fastened to the connector case 60, and are configured to have a metal-metal contact with the rear frame end 20, waterproofing between the rear frame end 20 and the connector case 60 is realized.

The plates 71, 72, 73 contact the rear frame end 20 by the motor-facing contact faces 715, 725, 735, and contact the heat sink 40 by the motor-facing-away contact faces 716, 726, 736. Further, the plates 71, 72, 73 are made of copper that has greater thermal conductivity than the aluminum that is used for making the rear frame end 20 and the heat sink 40. Therefore, as compared with the case in which the plates 71, 72, 73 are made of iron etc. whose thermal conductivity is smaller than aluminum, heat of the heat sink 40, on which the power module 50 is fastened, is appropriately transmitted toward the rear frame end 20. Thereby, heat is dissipated from the heat sink 40 to the external device via the plates 71, 72, 73 and the rear frame end 20. Further, surface treatment of the heat sink 40 is not required, because exposure of the heat sink 40 to an outside of the apparatus 1 is not required.

Further, by forming the plates 71, 72, 73 in a board shape, for example, an area size of the metal-metal contact portion is greatly increased in comparison to the collar type metal-metal contact, which is realized by inserting the collar into the insertion holes for the creep protection of those holes. Therefore, heat of the heat sink 40 is highly efficiently transmitted toward the rear frame end 20.

The first holes 711, 721, 731 are bored on the plates 71, 72, 73, into which the screws 81, 82, 83 for fastening the heat sink 40 and the rear frame end 20 with those plates 71, 72, 73 interposed therebetween, are inserted. Therefore, the heat sink 40 and the rear frame end 20 are fastened to each other with the plates 71, 72, 73 held in a binding manner, for appropriately transmitting heat of the heat sink 40 toward the rear frame end 20.

Further, the second holes 712, 713, 722 are bored on the plates 71, 72, into which the screws 76, 77, 78 for fastening the connector case 60 to the heat sink 40 are inserted. Therefore, the first hole 711 and the second holes 712, 713 are bored on the same plate 71, and the first hole 721 and the second hole 722 are formed on the same plate 72, which advantageously reduces the dimension error at the time of assembly of those parts. Further, the reduction of the dimension error during the assembly leads to the reduction of the detection error of the rotation angle sensor 33.

The motor-facing contact faces 715, 725, 735 of the plates 71, 72, 73 are formed to project toward the motor 10 side from the plate bases 651, 652, 653. Thereby, the contact between the plates 71, 72, 73 and the rear frame end 20 is securely made. Further, when the seal member 69 having elasticity is disposed at a position between the connector case 60 and the rear frame end 20, the crush rate of the seal member 69 is defined by setting a projection amount of the motor-facing contact faces 715, 725, 735 of the plates 71, 72, 73 toward the motor 10 side, thereby enabling a reduction of the dimension error during the assembly.

The heat sink 40 has the plate contact parts 41, 42, 43 that are formed to respectively fit to the plate bases 651, 652, 653. Thereby, the metal-metal contact between the plates 71, 72, 73 and the heat sink 40 is securely made.

Plural plates 71, 72, 73 are fastened onto the connector case 60. The plates 71, 72, 73 of the present embodiment have respectively different shapes. Thereby, according to the above-described structure of the driver device 1, the contacts between the plates 71, 72, 73, the rear frame end 20 and the heat sink 40 are appropriately made.

Second Embodiment

Figure 14:
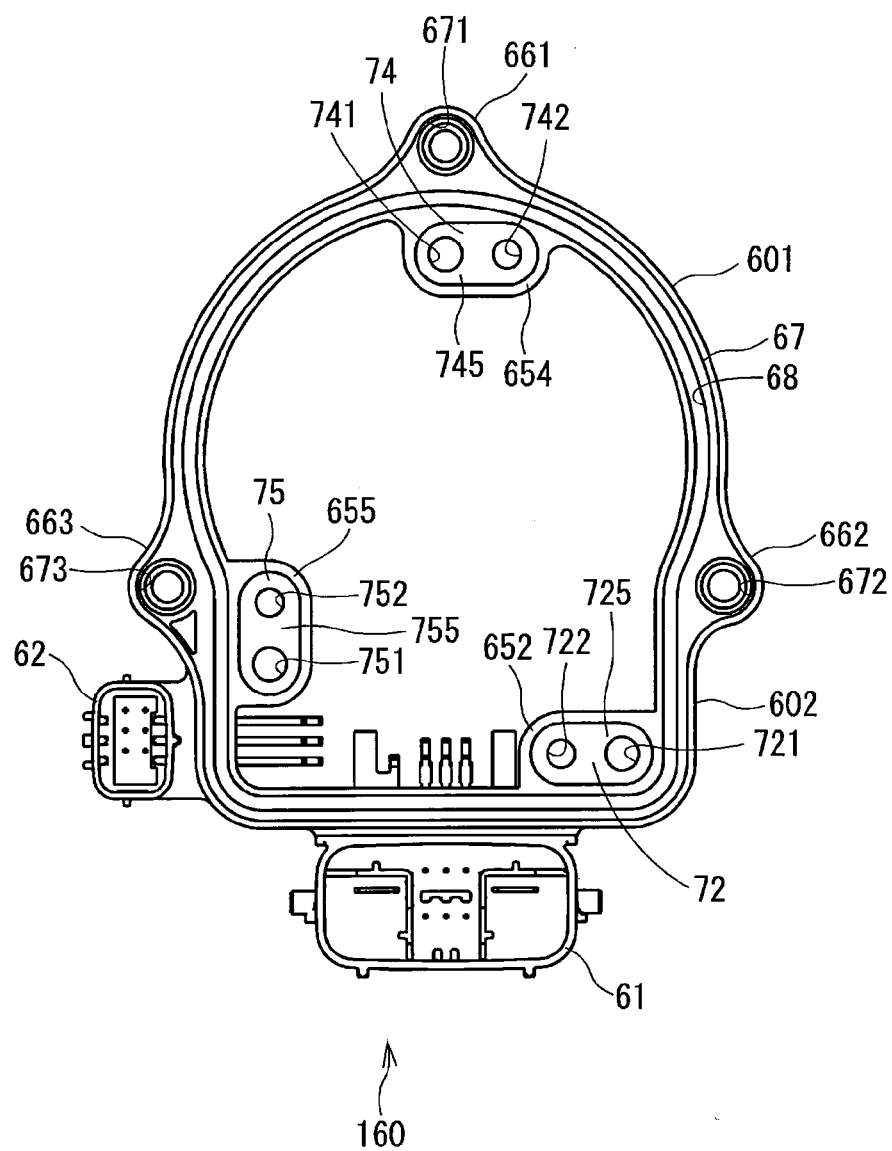
FIG. 14 is a plan view of a connector case seen from a motor-facing in a second embodiment of the present disclosure.
Figure 15:
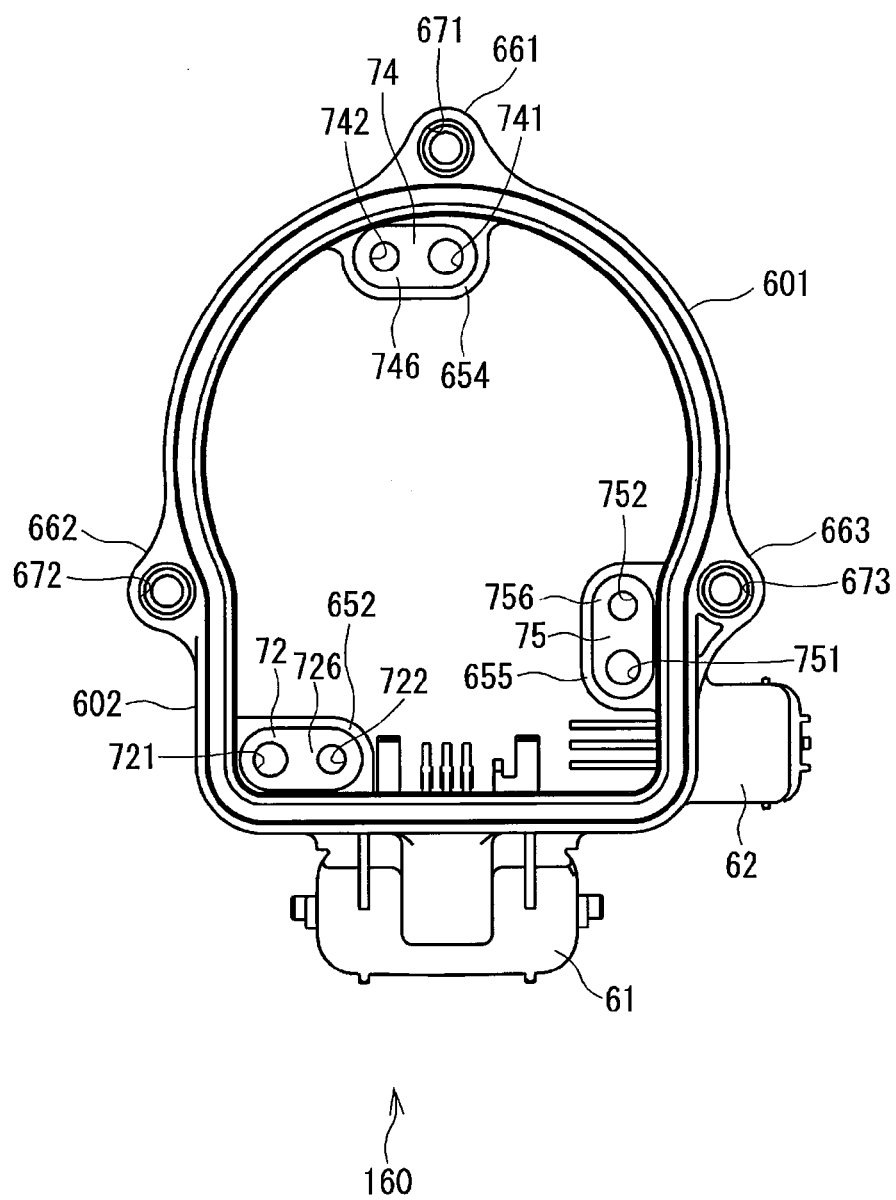
FIG. 15 is a plan view of the connector case seen from an opposite side of the motor in the second embodiment of the present disclosure.

The second embodiment of the present disclosure is shown in FIGS. 14 and 15. FIG. 14 corresponds to FIG. 8, and FIG. 15 corresponds to FIG. 9, respectively.

According to the present embodiment, the shape of a first plate 74 and the shape of a third plate 75 are different from the first embodiment. The shape of the second plate 72 is the same as that of the first embodiment.

The first plate 74 fastened to a first plate base 654 of a connector case 160 has the same shape as the second plate 72, and a first hole 741 and a second hole 742 are bored thereon. The first plate 74 is positioned to have the first hole 741 substantially put at the center of the arc part 601. The screw 81 (refer to FIG. 2 etc.) which fastens the heat sink 40 and the rear frame end 20 is inserted into the first hole 741 from the away-from-motor side. The screw 76 (refer to FIG. 12) for fastening the connector case 160 to the heat sink 40 is inserted into the second hole 742 from the motor 10 side.

The third plate 75 fastened to a third plate base 655 of the connector case 160 has the same shape as the second plate 72, and a first hole 751 and a second hole 752 are bored thereon. The third plate 75 is bored on an arc part 601 side of the connector formation part 602. The screw 83 (refer to FIG. 2 etc.), which fastens the heat sink 40 and the rear frame end 20, is inserted into the first hole 751 from the away-from-motor side. A screw for fastening the connector case 160 to the heat sink 40 is inserted into the second hole 752 from the motor 10 side.

A motor-facing contact face 745 of the first plate 74 projects from the first plate base 654 toward the motor 10 side, and contacts the contact surface 21 of the rear frame end 20. A motor-facing contact face 755 of the third plate 75 projects from the third plate base 655 toward the motor 10 side, and contacts the contact surface 21 of the rear frame end 20. Further, a motor-facing-away contact face 746 of the first plate 74 and a motor-facing-away contact face 756 of the third plate 75, respectively, contact the heat sink 40.

Although a structure about the heat sink is not illustrated, the first plate contact part which contacts the first plate 74 is formed to have a shape that fits into the first plate base 654. The same applies to the shape of the third plate contact part, which contacts the third plate 75, for the fitting into the third plate base 655.

In the present embodiment, three plates 72, 74, 75 have the same shape. Thereby, common parts can be used as those three plates 72, 74, 75.

Further, the same effects as the above-mentioned embodiment are achieved.

Other Embodiments

In the above-mentioned embodiments, the number of the plate members fastened to the connector case is three. In other embodiments, the number of the plate members fastened to the connector case may be arbitrarily determined.

Further, the plate member fastened to the connector case by insert molding in the above-mentioned embodiments may also be fastened to the connector case in any manner in other embodiments. For example, the plate member may be fastened thereto by outsert molding.

In the above-mentioned embodiments, plural plate members are disposed at the same height position.

In other embodiments, at least one of the plural plate members may be disposed at a different height position. Further, depending on the shape of the first/second heat dissipater, at least one of the plural plate members may have a different thickness.

In the above-mentioned embodiments, the slot where the seal member is disposed and the plate base are disposed to have substantially the same height position.

In other embodiments, a step portion may be provided to have the slot and the plate base at respectively different height positions.

In the above-mentioned embodiments, two, i.e., the first connector and the second connector, are provided in the connector case.

In other embodiments, not only two but one or three or more connector cases may be provided in the connector case.

In the above-mentioned embodiments, the connector case comprises an arc part and a connector formation part. In other embodiments, the connector case may be formed in any shape depending on the shape of the first heat dissipater and the second heat dissipater, etc.

In the above-mentioned embodiments, the first heat dissipater and the second heat dissipater are made of aluminum, and the plate member is made of copper.

In other embodiments, as long as thermal conductivity of the plate members is equal to or greater than that of the first heat dissipater and the second heat dissipater, the plate members may be made of any material. For example, when each of the first heat dissipater, which is the rear frame end, and the second heat dissipater, which is the heat sink is made of aluminum, the plate member may also be made of aluminum. In other words, thermal conductivity of the plate member is considered as being equal to or greater than that of the first and second heat dissipaters, when thermal conductivity of the plate member is the same as a lower thermal conductivity among the first and second heat dissipaters.

In the above-mentioned embodiment, the contact surface of the first heat dissipater, which contacts the plate member, is formed as a plane/flat surface, and the second heat dissipater has the contact part that contacts (i.e., engages) the plate member.

In other embodiments, the first heat dissipater may have the contact part which projects toward the plate member side. The second heat dissipater may also have a planar/flat surface. Further, both of the first and second heat dissipaters may have the contact part.

In the above-mentioned embodiment, the heat generator fastened to the second heat dissipater is the power module. In other embodiments, other electronic components which generate heat, for example, by receiving an electric power supply, etc., may be fastened to the second heat dissipater.

In the above-mentioned embodiment, the driver device is applied to the electric power steering device. In other embodiments, the driver device may be applied to other devices other than the electric power steering device.

Although the present disclosure has been fully described in connection with preferred embodiment thereof with reference to the accompanying drawings, it is to be noted that various changes and modifications will become apparent to those skilled in the art, and such changes, modifications, and summarized scheme are to be understood as being within the scope of the present disclosure as defined by appended claims.

What is claimed is:

1. A driver device comprising:
a motor driven by an electric power supplied to a winding wire within the motor;
a rear frame end serving as a first heat dissipater disposed on an axial end of the motor;
a second heat dissipater having a heat generator fastened thereon;
a connector case disposed on an outside of the second heat dissipater and having a connector connecting the second heat dissipater to an external device; and
a plate member attached to a plate base that is formed on the connector case, the plate member contacting (a) the first heat dissipater with a motor-facing contact face and (b) the second heat dissipater with a motor-facing-away contact face, wherein
heat conductivity of the plate member is equal to or greater than heat conductivity of the first heat dissipater and the second heat dissipater combined.

2. The driver device of claim 1, wherein
the plate member has a first hole into which a first fastening member is inserted to fasten the second heat dissipater to the first heat dissipater in a binding manner with the plate member interposed therebetween.

3. The driver device of claim 2, wherein
the plate member has a second hole into which a second fastening member is inserted to fasten the connector case to the second heat dissipater.

4. The driver device of claim 1, wherein
the motor-facing contact face protrudes toward the motor from the plate base.

5. The driver device of claim 1, wherein
the second heat dissipater has a plate contact part that is shaped to engage the motor-facing-away contact face of the plate base.

6. The driver device of claim 1, wherein
the connector case has a plurality of plate members attached thereto.

7. The driver device of claim 6, wherein
the plurality of plate members have an identical shape.

8. The driver device of claim 6, wherein
each of the plurality of plate members has a different shape.

* * * * *